US009608220B1

United States Patent
Afzali-Ardakani et al.

(10) Patent No.: US 9,608,220 B1
(45) Date of Patent: Mar. 28, 2017

(54) HYBRID HETEROJUNCTION PHOTOVOLTAIC DEVICE

(71) Applicant: International Business Machines Corporation, Armonk, NY (US)

(72) Inventors: Ali Afzali-Ardakani, Ossining, NY (US); Tze-Chiang Chen, Yorktown Heights, NY (US); Oki Gunawan, Westwood, NJ (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/967,747

(22) Filed: Dec. 14, 2015

Related U.S. Application Data

(63) Continuation of application No. 14/856,798, filed on Sep. 17, 2015.

(51) Int. Cl.
*H01L 21/00* (2006.01)
*H01L 51/42* (2006.01)
*H01L 51/00* (2006.01)

(52) U.S. Cl.
CPC ........ *H01L 51/4213* (2013.01); *H01L 51/001* (2013.01); *H01L 51/0003* (2013.01); *H01L 51/0055* (2013.01)

(58) Field of Classification Search
CPC ............. H01L 51/4213; H01L 51/0003; H01L 51/001; H01L 51/0055

USPC ...................................................... 438/82–83
See application file for complete search history.

(56) References Cited

U.S. PATENT DOCUMENTS

| 7,491,642 | B2 * | 2/2009 | Lewis | H01L 21/28512 438/642 |
| 8,334,545 | B2 * | 12/2012 | Levermore | H01L 27/3213 257/40 |
| 8,742,253 | B1 * | 6/2014 | Menezes | H01L 31/0322 136/263 |
| 2012/0282395 | A1 * | 11/2012 | El-Ashry | B82Y 30/00 427/122 |

OTHER PUBLICATIONS

Ali Afzali-Ardakani et al, "Hybrid Heterojunction Photovoltaic Device," U.S. Appl. No. 14/856,798, filed Sep. 17, 2015.
List of IBM Patents or Patent Applications Treated as Related; (Appendix P), Filed Sep. 16, 2016, 2 pages.

* cited by examiner

*Primary Examiner* — Xinning Niu
*Assistant Examiner* — Vu A Vu
(74) *Attorney, Agent, or Firm* — Cantor Colburn LLP; Louis Percello

(57) ABSTRACT

A photovoltaic device includes an inorganic substrate having a surface; an organic monolayer disposed onto the surface of the inorganic substrate, the inorganic monolayer having the following formula: ~X—Y, wherein X is an oxygen or a sulfur; Y is an alkyl chain, an alkenyl chain, or an alkynyl chain; and X covalently bonds to the surface of the inorganic substrate by a covalent bond; a doped organic material layer disposed onto the organic monolayer; and a conductive electrode disposed onto a portion of the doped organic material.

8 Claims, 7 Drawing Sheets

HYBRID HETEROJUNCTION PHOTOVOLTAIC DEVICE

BACKGROUND

This application is a continuation of and claims priority from U.S. patent application Ser. No. 14/856,798, filed on Sep. 17, 2015, entitled "HYBRID HETEROJUNCTION PHOTOVOLTAIC DEVICE", the entire contents of which are incorporated herein by reference.

BACKGROUND

The present disclosure generally relates to semiconductors, and more specifically, to photovoltaic devices.

Organic materials are used in photovoltaic applications. Organic materials are relatively low in cost and can be used over large surface areas, e.g., on flexible low-cost substrates. However, photovoltaic devices with organic materials are less efficient than devices with inorganic materials. The smaller diffusion length of minority carriers in organic materials, compared to inorganic materials, may decrease efficiency.

Accordingly, heterojunction stacks with an inorganic substrate (an absorption layer), for example silicon, and an organic material contact are advantageous. Heterojunction devices combine the organic material's low-temperature, large-area processing capability with the inorganic material's large diffusion length, which substantially eliminates excessive recombination in the absorption layer.

In heterojunction devices, the dangling bonds at the surface of the inorganic material are passivated to minimize recombination loss at the organic/inorganic interface. Wide band gap materials, for example, PQ (9,10-phenanthrenequinone), are used to passivate the surface of silicon.

SUMMARY

According to an embodiment, a photovoltaic device includes an inorganic substrate having a surface; an organic monolayer disposed onto the surface of the inorganic substrate, the inorganic monolayer having the following formula: ~X—Y, wherein X is an oxygen or a sulfur; Y is an alkyl chain, an alkenyl chain, or an alkynyl chain; and X covalently bonds to the surface of the inorganic substrate by a covalent bond; a doped organic material layer disposed onto the organic monolayer; and a conductive electrode disposed onto a portion of the doped organic material.

According to another embodiment, a photovoltaic device includes an inorganic substrate having a surface; an organic monolayer disposed onto the surface of the inorganic substrate, the inorganic monolayer having the following formula: ~X—Y—Z, wherein X is an oxygen or a sulfur; Y is an alkyl chain, an alkenyl chain, or an alkynyl chain; Z is a methyl group or an epoxy group; and X covalently bonds to the surface of the inorganic substrate by a covalent bond; a doped organic material layer disposed onto the organic monolayer; and a conductive electrode disposed onto a portion of the doped organic material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-4D illustrate various embodiments, in which:

FIG. 1 illustrates an exemplary method of making a heterojunction stack according to a first embodiment;

FIG. 2 illustrates an exemplary method of making a heterojunction stack according to a second embodiment;

FIG. 3 illustrates an exemplary method of making a heterojunction stack according to a third embodiment;

FIGS. 4A-4D illustrate photovoltaic devices according to various exemplary embodiments, which:

FIG. 4A is a cross-sectional side view of the emitter portion of a photovoltaic device;

FIG. 4B is a cross-sectional of the emitter portion of a photovoltaic device further including a transparent conductive layer (TCL);

FIG. 4C is a cross-sectional side view of the back surface field (BSF) portion of a photovoltaic device;

FIG. 4D is a cross-sectional side view of the BSF portion of a photovoltaic device further including a TCL layer;

DETAILED DESCRIPTION

Figure 1:
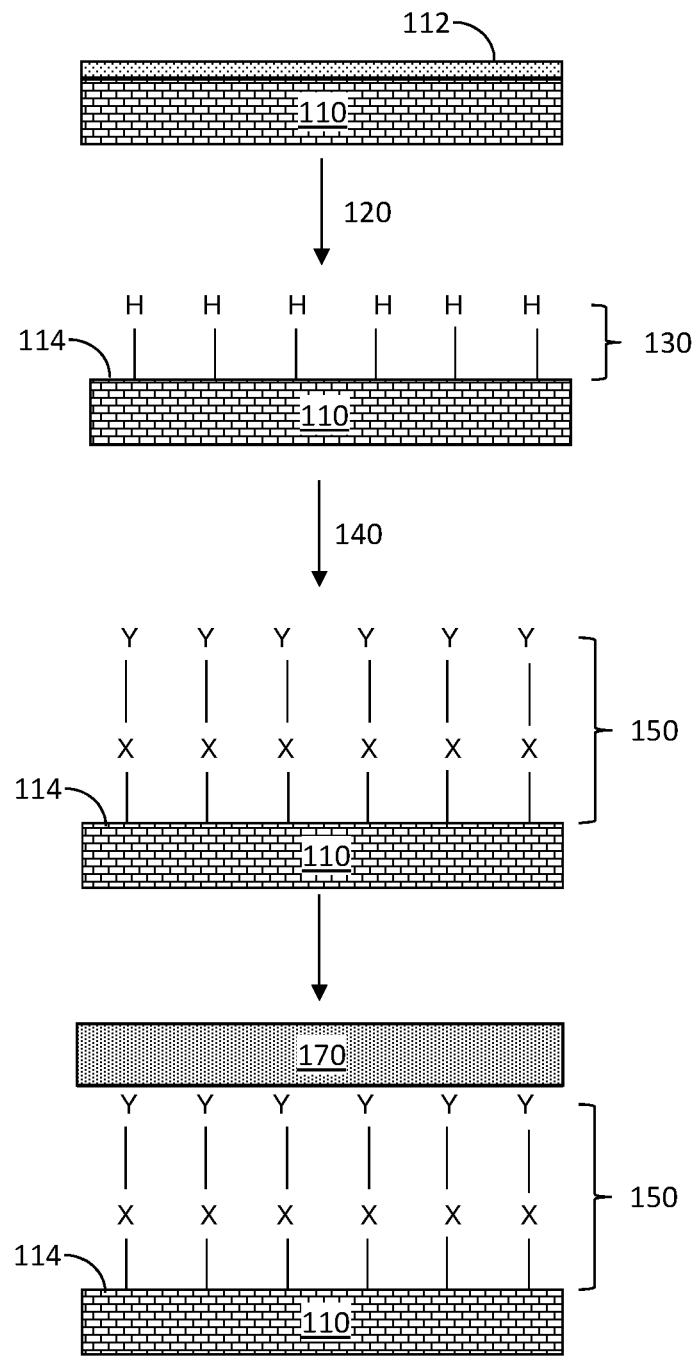

Organic self-assembled monolayers (SAM) of long-chain alcohols or thiols may provide sufficient surface passivation to suppress minority carrier recombination, as well as sufficiently allow majority carrier transport. The surface passivation methods are used to form hybrid Schottky barrier photovoltaic devices with conductive layer/undoped organic material layer/SAM/inorganic substrate emitter structures. The workfunction difference between the conductive layer and the inorganic substrate has a substantial effect on the effective barrier height of the devices. The substantially fully depleted organic material has a smaller effect on the effective barrier height. Accordingly, carrier splitting at the emitter junction and solar cell efficiency is limited by the effective height of the hybrid Schottky barrier. Carrier recombination within the organic material also contributes to efficiency loss.

Accordingly, various embodiments described herein provide photovoltaic devices with a conductor layer/doped organic material layer/SAM/inorganic substrate stacked structure. The stacked semiconducting structures form "p-n heterojunctions" instead of hybrid Schottky barriers and dominate the band-bending at the emitter. The higher barrier height of the p-n heterojunction improves carrier splitting. Using a doped organic material also allows for thin and not yet fully depleted organic layers. The undepleted organic layers reduce recombination within the organic material. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 2:
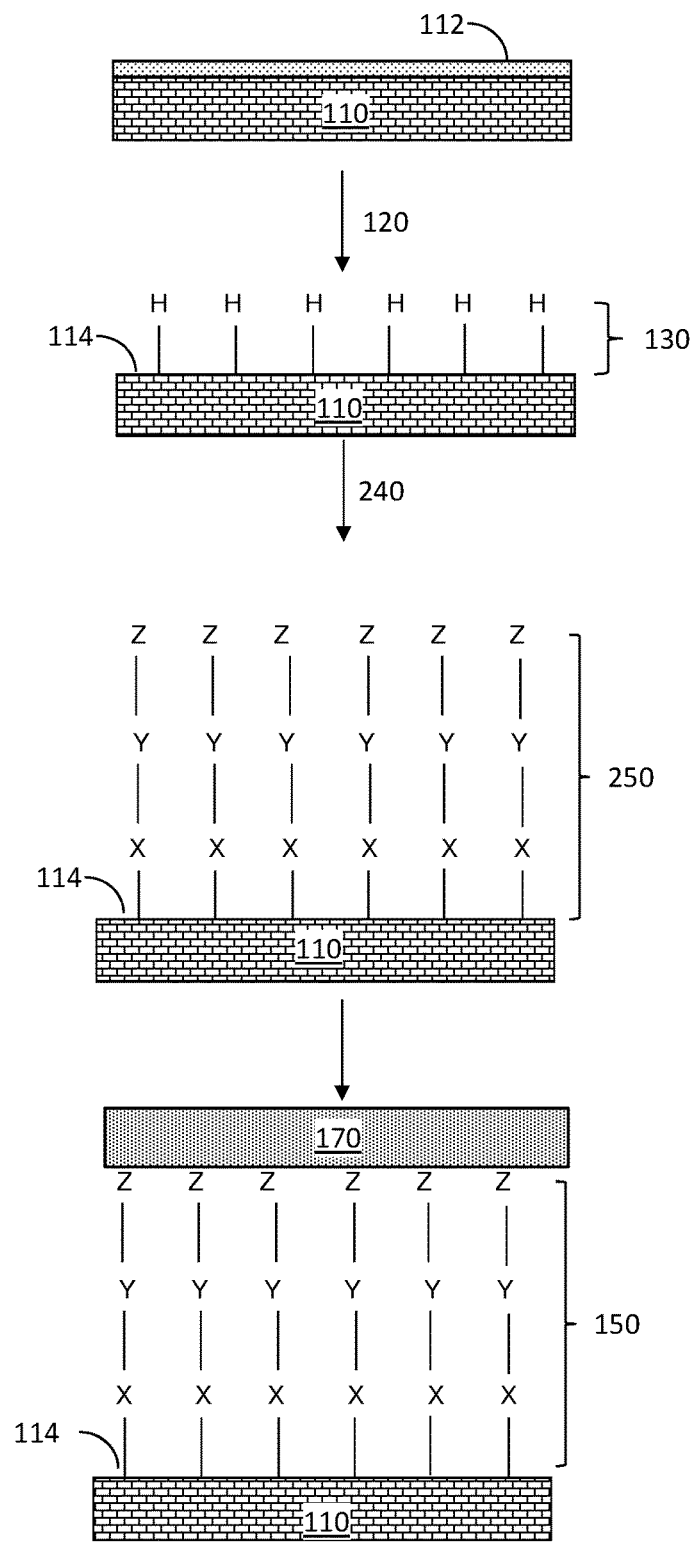
Figure 3:
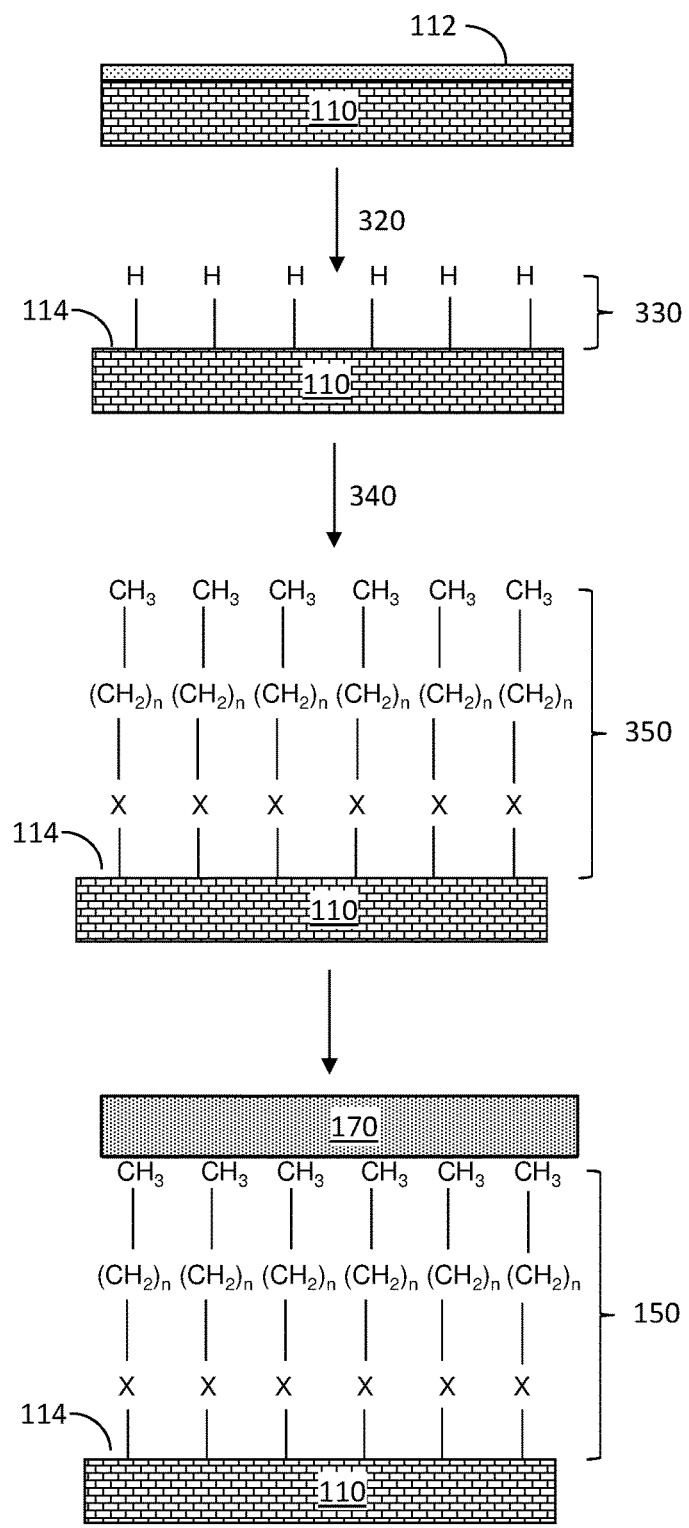

Turning now to the Figures, FIGS. 1-3 illustrate methods of making a photovoltaic device according to various embodiments. FIG. 1 illustrates an exemplary method of making a photovoltaic device according to a first embodiment. An inorganic substrate 110 includes a native oxide layer 112 disposed onto the surface of the inorganic substrate 110. The inorganic substrate 110 includes an inorganic semiconducting material, for example, silicon, n-type silicon, p-type silicon, or any combination thereof. The inorganic substrate 110 includes any other suitable inorganic material, including, but not limited to, group IV semiconductors, for example, silicon, germanium, silicon germanium, III-V semiconductors (e.g., gallium arsenide), or any combination thereof.

The inorganic substrate 110 may be doped with a dopant. The dopant may be any suitable type of dopant including, for example, an n-type dopant or a p-type dopant, depending on the type of device. For example, when the inorganic substrate 110 includes silicon, n-type dopant may include phosphorus or arsenic, and p-type dopant may include boron or gallium.

The thickness of the inorganic substrate 110 generally varies and is not intended to be limited. In some embodiments, the thickness of the inorganic substrate 110 is in a range from about 100 nanometers (nm) to about 1 millimeter (mm); although thinner and thicker layers may be used as well.

In one exemplary embodiment, the inorganic substrate 110 includes of a solar-grade (single-crystalline or multi-crystalline) silicon wafer and has a thickness in the range from about 100 to about 300 micrometers ($\mu$m). In another exemplary embodiment, the inorganic substrate 110 includes a 1-20 $\mu$m silicon layer transferred from a host silicon wafer and bonded onto a flexible handle substrate (e.g., plastic) using layer transfer and bonding techniques. In a further exemplary embodiment, the inorganic substrate 110 includes a 100 nm-2 $\mu$m thick GaAs layer grown epitaxially on a Ge handle substrate. In yet another exemplary embodiment, the inorganic substrate 110 includes a 100 nm-2 $\mu$m thick GaAs layer transferred from a host substrate (e.g., Ge or GaAs) and bonded onto a flexible handle substrate (e.g., plastic) using layer transfer and bonding techniques.

The composition of the native oxide layer 112 depends on the composition of the inorganic substrate 110 as well as the prior treatment of the inorganic substrate, e.g., the storage/ambient conditions or any prior surface treatment/cleaning prior to storage. The native oxide layer 112 may or may not be a stoichiometric oxide. In one example, the inorganic substrate 110 includes silicon, and the native oxide layer 112 includes silicon dioxide ($SiO_2$). In another example, the inorganic substrate 110 includes germanium, and the native oxide layer 112 is comprised of germanium dioxide ($GeO_2$). In a further example, the inorganic substrate 110 includes GaAs, and the native oxide layer 112 includes $Ga_2O_3$, $As_2O_3$, $As_2O_5$, or any combination thereof.

When the inorganic substrate 110 includes silicon, the native oxide layer 112 is etched 120 (removed) to form hydrogenated silicon (Si—H) bonds 130 on the etched inorganic substrate surface 114. When the inorganic substrate 110 includes an inorganic material that is not silicon, etching of the native oxide layer 112 forms an [inorganic atom—H] bond on the surface 114 of the inorganic substrate 110.

The etching 120 process can be an acidic wet etching process. In one embodiment, the etching 120 is performed by disposing a dilute solution of hydrofluoric acid (HF) onto the native oxide layer 112. Other non-limiting examples of etching 120 include hydrogen plasma etching.

After etching 120, the inorganic substrate 110 is immersed in a solution of an alcohol or thiol 140. The inorganic substrate 110 is immersed in the solution of the alcohol or thiol 140 to form a reaction product.

The alcohol or the thiol 140 compounds have the following formula: HX—Y, wherein H is hydrogen, X is sulfur or oxygen, and Y is an alkyl chain, an alkenyl chain, an alkynyl chain, or any combination thereof. Y can include any number of carbons, for example, from about 4 to about 21 carbons. In one embodiment, Y is substantially free of branching.

In another embodiment, Y is an alkenyl chain, and the double bonds in the alkenyl chain include are all cis double bonds. Yet, in another embodiment, Y is an alkenyl chain, and the double bonds in the alkenyl chain include all trans double bonds.

When Y is an alkyl chain, Y has the following formula: $(CH_2)_nCH_3$, wherein n is an integer from about 4 to about 21. The integer n can be about or in any range from about 4, 5, 6, 7, 8, 9, 10, 11, 12, 13, 14, 15, 16, 17, 18, 19, 20, and 21.

In some embodiments, the reaction of the alcohol or thiol 140 with the inorganic substrate 110 is performed at an elevated temperature. For example, the reaction may be performed by heating the inorganic substrate 110. The heating may be performed, for example, at a temperature in a range from about 90 to about 150° Celsius (° C.).

The inorganic atom—H bonds 130, for example, Si—H bonds, on the surface 114 of the inorganic substrate 110 react with the alcohol or the thiol 140 to form an organic monolayer 150 (self-assembled monolayer (SAM)) on the surface 114 of the inorganic substrate 110. The organic monolayer 150 passivates the surface 114 of the inorganic substrate 110 by saturating the dangling —H bonds. The resulting organic monolayer 150 has the following formula: ~X—Y, wherein X is an oxygen or a sulfur; Y is an alkyl chain, an alkenyl chain, or an alkynyl chain; and X covalently bonds to the surface 114 of the inorganic substrate 110 by an inorganic atom—electronegative atom bond, for example, a silicon-oxygen bond (Si—O~) or a silicon-sulfur bond (Si—S~).

The organic monolayer 150 forms a passivation layer that is relatively thin, which means the potential barrier formed at the heterojunction between the organic monolayer 150 and the inorganic substrate 110 is small, regardless of the existing band offset. Thus, hole transport at the heterojunction is not affected.

The organic monolayer 150 has a thickness that generally varies and is not intended to be limited. In one aspect, the organic monolayer 150 has a thickness in a range from about 0.5 nm to about 5 nm. In another aspect, the organic monolayer 150 has a thickness in a range from about 2 to about 3 nm. Yet, in another aspect, the organic monolayer 150 has a thickness in a range from about 1 to about 2 nm. Still yet, in another aspect, the organic monolayer 150 has a thickness about or in any range from about 0.5, 1.0, 1.5, 2.0, 2.5, 3.0, 3.5, 4.0, 4.5, and 5.0 nm.

After forming the organic monolayer 150, a doped organic material 170 is disposed onto the surface of the organic monolayer 150. An organic semiconducting material (e.g., pentacene or rubrene) is doped with a dopant. The dopant is a p-type dopant or an n-type dopant.

Disposing the doped organic material 170, onto the organic monolayer 150 forms a p-n heterojunction. The built-in potential of the p-n heterojunction is primarily determined by the workfunction difference between the doped organic material 170 and the inorganic substrate 110.

The disclosed devices and methods contrast with methods in which use an undoped organic material (not shown), which forms a hybrid Schottky junction when used in conjunction with a conductive electrode. The resulting built-in potential of the Schottky junction is determined primarily by the workfunction difference between conductive electrode and inorganic substrate. Although the effective barrier height of the hybrid Schottky junction may be increased by increasing the thickness of the undoped organic material, increasing the undoped organic material thickness has adverse effects. For example, increasing the undoped material thickness may increase the series resistance, increase the minority carrier recombination within the undoped organic material, and increase the parasitic absorption loss within the undoped organic material.

In contrast, a p-n heterojunction with sufficiently high barrier height is established with relatively thin doped organic materials. The methods and devices disclosed herein result in lower series resistance, lower minority carrier recombination, and lower parasitic absorption loss. Further, provided that the amount of doping and thickness of the doped organic material are high enough to prevent the doped organic material from becoming fully depleted, the workfunction of the conductive electrode only has a small effect on the built-in potential of the p-n heterojunction. This limited effect provides flexibility in choosing the material type and/or the preparation technique used for the conductive electrode, which lowers material and/or process costs.

In preferred embodiments, the n-type doped organic materials are selected from organic materials with intrinsic electron transport properties and the p-type doped organic materials are selected from organic materials with intrinsic hole transport properties. As known in the art, electron transport organic materials typically (but not necessarily) have hole blocking properties, and hole transport organic materials typically (but not necessarily) have electron blocking properties.

Non-limiting examples of suitable organic semiconductor materials that may provide hole transport (or electron blocking) functions include pentacene, rubrene, anthracene, poly (3-hexylthiophene) (P3HT); tetraceno[2,3-b]thiophene; α-sexithiophene; poly(3,3'''-didodecylquaterthiophene); poly(2,5-bis(3-decylthiophen-2-yl)thieno[3,2-b]thiophene); N,N'-Bis(3-methylphenyl)-N,N'-diphenyl-benzidine (TPD); N,N'-Bis(phenanthren-9-yl)-N,N'-bis(phenyl)-benzidine (PAPB); 4,4'-Bis(N-carbazolyl)-1,1'-biphenyl (CBP); 1,3-Bis(N-carbazolyl)benzene (mCp); 4,4'-Cyclohexylidenebis [N,N-bis(4-methylphenyl)benzenamine] (TAPC); 2,2'Dimethyl-N,N'-di-[(1-naphthyl)-N,N'-diphenyl]-1,1'-biphenyl-4,4'-diamine (α-NPD); 9,9-Dimethyl-N,N'-di(1-naphthyl)-N,N'-diphenyl-9H-fluorene-2,7-diamine (NPB); N,N'-Di-[(1-naphthyl)-N,N'-diphenyl]-1,1'-biphenyl-4,4'-diamine (NPD); N,N'-Di(2-naphthyl-N,N'-diphenyl)-1,1'-biphenyl-4,4'-diamine (β-NPB); Tri-p-tolylamine; 4,4',4''-Tris[phenyl (m-tolyl)amino]triphenylamine; Tris(4-carbazoyl-9-ylphenyl)amine (TCTA); Tetra-N-phenylbenzidine (TPB); 1,3-Bis(triphenylsilyl)benzene; poly-aniline; poly(3,4-ethylenedioxythiophene); poly(3,4-ethylenedioxythiophene)-poly(styrenesulfonate) (PEDOT:PSS); poly(3,4-ethylenedioxythiophene); tetracyanoethylene; poly(thiophene-3-[2-(2-methoxyethoxy) ethoxy]-2,5-diyl); bis-poly(ethyleneglycol) (PEDOT:PEG); 7,7,8,8-Tetracyanoquinodimethane, or any combination thereof.

Non-limiting examples of organic semiconductor materials that provide electron transport (or hole blocking) functions include bathocuproine (BCP); bathophenanthroline (BPhen); 3-(Biphenyl-4-yl)-5-(4-tert-butylphenyl)-4-phenyl-4H-1,2,4-triazole (TAZ); 2-(4-Biphenylyl)-5-phenyl-1, 3,4-oxadiazole (PBD); bis(8-hydroxy-2-methylquinoline)-(4-phenylphenoxy)aluminum; 2,5-Bis(1-naphthyl)-1,3,4-oxadiazole (BND); 2-(4-tert-Butylphenyl)-5-(4-biphenylyl)-1,3,4-oxadiazole (Butyl-PBD); Tris-(8-hydroxyquinoline) aluminum (Alq3); hexadecafluoro copper phthalocyanine ($F_{16}$CuPc); naphthalene diimide derivatives; perylene diimide derivatives; $C_{60}$; and combinations thereof.

The dopant includes, for example, a p-type dopant or a single electron oxidant. Non-limiting examples of dopants include organic single electron oxidants, metal organic complexes, pi-electron acceptors, silver salts, or any combination thereof. Non-limiting examples of organic single electron oxidants include antimony compounds, for example, trialkyloxonium hexachlroantimonate and antimony pentachloride, nitrosonium salts (for example, triethyl oxonium tetrafluoroborate), tris-(pentafluorophenyl) borane, and nitrosonium cation. Non-limiting examples of metal organic complexes include tris-(2,2'-bipyridyl) cobalt (III) and tris-(2,2'-bipyridyl) ruthenium (II). Non-limiting examples of pi electron acceptors include tetracyanoquinodimethane, benzoquinone, tetrachlorobenzoquinone, tetrafluorobenzoquinone, tetracynaoethylene, tetrafluoro-tertracyanoquinodimethane, chloranil, tromanil, and dichlorodicyanobenzoquinone. Non-limiting examples of silver salts include silver fluoride and silver trifluoroacetate.

In one embodiment, the organic material is doped by a solution process. In another embodiment, the organic material is doped by performing a thermal evaporation process under a vacuum. Solution processed doping with the dopant is employed in an organic solvent including, but not limited to, dichloromethane, acetonitrile, chloroform and mixtures thereof. When the dopant is an organometallic dopant, the organic solvent may include, for example, acetonitrile, tetrahydrofuran, aromatic hydrocarbons, chlorinated solvents (e.g., dichloromethane and chloroform), or any combination thereof. When the dopant includes an inorganic salt, the organic solvent may include, for example, an alcohol, water, or a combination thereof.

In some embodiments, the dopant is used in a concentration in a range from about 1 to about 500 mM. In other embodiments, the dopant is used in a concentration in a range from about 1 to about 20 mM.

After doping the organic material, the dopant is present in the doped organic material at a concentration in a range from about 10 to about 100 mM. In other embodiments, the dopant is present in the doped organic material at a concentration in a range from about 25 to about 75 mM.

In one exemplary embodiment, the dopant includes triethyloxonium hexachloroantimonate $((C_2H_5)_3O^+SbCl_6^-)$, and the organic material includes pentacene. The dopant is used at a concentration range of about 1 to about 20 mM, and temperature range of about 10 to about 100° C., and solution process doping is performed in acetonitrile. In other embodiments, the temperature is about 30 to 100° C., and in still other embodiments, the temperature is about 70 to about 80° C. The reaction occurs according to the following exemplary reaction Scheme 1:

Scheme 1

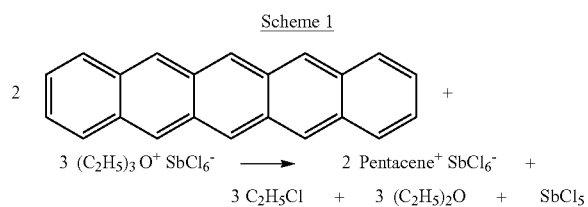

2 [pentacene] + 3 $(C_2H_5)_3O^+$ $SbCl_6^-$ → 2 Pentacene$^+$ $SbCl_6^-$ + 3 $C_2H_5Cl$ + 3 $(C_2H_5)_2O$ + $SbCl_5$ FIG. 2 illustrates a method of making a photovoltaic device according to a second embodiment. An inorganic substrate 110 includes silicon and has a native oxide layer 112 disposed on its surface. The native oxide layer 112 is etched 120 (removed) to form Si—H bonds 130 on the etched inorganic surface 114.

The inorganic substrate 110 is immersed in a solution of an alcohol or thiol 240 at an elevated temperature. In some embodiments, the temperature is in a range from about 80 to about 150° C. The alcohol or the thiol 240 has the following formula: HX—Y—Z, wherein H is hydrogen; X is sulfur or oxygen, Y is an alkyl chain, an alkenyl chain, an alkynyl chain, or any combination thereof; and Z is a methyl group or an epoxy group. X covalently bonds to the surface of the inorganic substrate 110 by a silicon-oxygen bond (Si—O~) or a silicon-sulfur bond (Si—S~). Any of the above descriptions for Y in the alcohol or thiol 140 having the formula HX—Y (described in FIG. 1) are applicable for HX—Y—Z.

The reaction of the alcohol or thiol 240 with the inorganic substrate 110 may be promoted by heating the inorganic substrate 110. The Si—H bonds 130 on the surface 114 of the inorganic substrate 110 react with the alcohol or the thiol 240 to form an organic monolayer 250 on the surface 114 of the inorganic substrate 110. The organic monolayer 250 passivates the surface of the inorganic substrate 110 by saturating the dangling hydrogen (—H) bonds.

The resulting organic monolayer 250 has the following formula: ~X—Y—Z, wherein X is an oxygen or a sulfur; Y is an alkyl chain, an alkenyl chain, or an alkynyl chain; Z is a methyl group or an epoxy group; and X covalently bonds to the surface 114 of the inorganic substrate 110 by a silicon-oxygen bond (Si—O~) or a silicon-sulfur bond (Si—S~). The organic monolayer 250 forms a passivation layer that is relatively thin and has a thickness described above for organic monolayer 150 (see FIG. 1).

After forming the organic monolayer 250, a doped organic material 170 is disposed onto the surface of the organic monolayer 150 (see FIG. 1).

FIG. 3 illustrates a method of making a photovoltaic device according to a third embodiment. An inorganic substrate 110 has a native oxide layer 112 disposed on its surface. The inorganic substrate 110 includes, for example, silicon. The native oxide layer 112 is etched 320 (removed) to form [organic atom—H] bonds 330, for example, Si—H bonds, on the etched inorganic surface 114.

The inorganic substrate 110 may be immersed in a solution of an alcohol or thiol 340 at an elevated temperature. The alcohol or the thiol 340 has the following formula: HX—(CH$_2$)$_n$—CH$_3$, wherein X is an oxygen or a sulfur, and n is an integer from about 4 to about 21. The integer n can be about or in any range from about 4, 5, 6, 7, 8, 9, 10, 11, 12, 13, 14, 15, 16, 17, 18, 19, 20, and 21.

The reaction of the alcohol or thiol 340 with the inorganic substrate 110 may be promoted by heating the inorganic substrate 110. The [inorganic atom—H] bonds 330, for example Si—H bonds, on the surface 114 of the inorganic substrate 110 react with the alcohol or the thiol 340 to form an organic monolayer 350 on the surface 114 of the inorganic substrate 110. The organic monolayer 350 passivates the surface of the inorganic substrate 110 by saturating the dangling bonds.

The organic monolayer 350 has the following formula: ~X—(CH2)n-CH3, wherein X is an oxygen or a sulfur; n is an integer from about 4 to about 21; and X covalently bonds to the surface of the inorganic substrate 110 to form a covalently bonded ether (e.g., Si—O—(CH2)n-CH3) or a covalently bonded thioether (e.g., Si—S—(CH2)n-CH3) on the surface 114 of the inorganic substrate 110. The integer n can be about or in any range from about 4, 5, 6, 7, 8, 9, 10, 11, 12, 13, 14, 15, 16, 17, 18, 19, 20, and 21. The organic monolayer 350 forms a passivation layer that is relatively thin and has a thickness described above for organic monolayer 150.

After forming the organic monolayer 350, a doped organic material 170 is disposed onto the surface of the organic monolayer 350 (see FIG. 1).

Figure 4A:
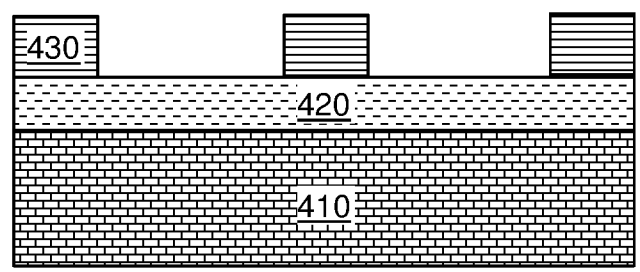

FIGS. 4A-4D illustrate photovoltaic devices including the surface passivated inorganic material/doped organic material stacks described in FIGS. 1-3. FIG. 4A is a cross-sectional side view of the emitter portion of a photovoltaic device. The photovoltaic device includes an inorganic substrate 410. The inorganic substrate 410 includes, for example, silicon. The inorganic substrate 410 is doped with dopant. The dopant may be n-type dopant (e.g., phosphorus or arsenic for silicon substrates) or a p-type dopant (e.g., boron or gallium for silicon of substrates). The inorganic substrate 410 is surface passivated by forming an organic monolayer on the surface of the inorganic substrate 410 as described above in FIGS. 1-3.

A doped organic material 420 is disposed onto the inorganic substrate 410. The doped organic material 420 is doped with a different type of dopant than the inorganic substrate 410. For example, when the inorganic substrate 410 is doped with a p-type dopant, the organic material 420 is doped with an n-type dopant. When the inorganic substrate 410 is doped with an n-type dopant, the organic material 420 is doped with a p-type dopant.

A conductive electrode 430 is disposed over the doped organic material 420. The conductive electrode 430 may define a grid pattern. The conductive electrode 430 includes a conductive metal. Non-limiting examples of conductive metals for the conductive electrode 430 include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

Figure 4B:
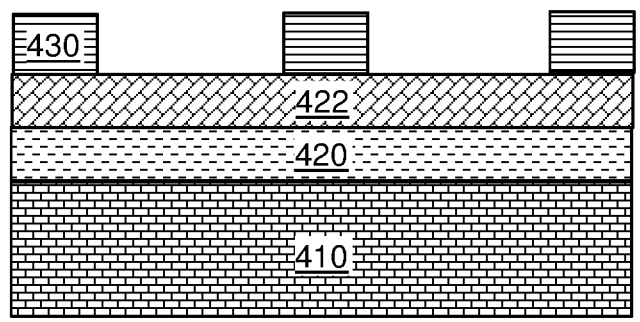

FIG. 4B is a cross-sectional of the emitter portion of a photovoltaic device including a transparent conductive layer (TCL) 422. The TCL layer 422 is disposed between the doped organic material 420 and the conductive electrode 430. The TCL layer 422 is optional. The TCL layer 422 may improve lateral carrier collection at the conductive electrode 430. The TCL layer 422 may also serve as an anti-reflective coating. Non-limiting examples of suitable materials for the TCL layer 422 include conductive polymers (e.g., poly(3, 4-ethylenedioxythiophene) polystyrene sulfonate (PEDT: PSS)), transparent conductive oxides (e.g., indium tin oxide (ITO) and aluminum doped zinc oxide (ZnO:Al)), graphene, or any combination thereof.

Other emitter configurations, in addition to those shown in FIGS. 4A and 4B may be used. For example, back-contact emitter configurations with a blanket metal or grid may be used. Interdigitated configurations are also suitable.

Figure 4C:
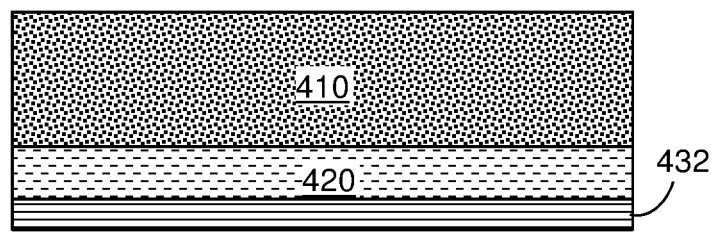

FIG. 4C is a cross-sectional side view of the back-surface-field (BSF) portion of a photovoltaic device. The photovoltaic device includes an inorganic substrate 410. The inorganic substrate 410 includes, for example, silicon. The inorganic substrate 410 is doped with dopant. The dopant may be n-type dopant (e.g., phosphorus or arsenic for silicon substrates) or a p-type dopant (e.g., boron or gallium for silicon of substrates). The inorganic substrate 410 is surface passivated by forming an organic monolayer on the surface of the inorganic substrate 410 as described above in FIGS. 1-3.

A doped organic material 420 is disposed onto the inorganic substrate 410. The doped organic material 420 is doped with a same type of dopant than the inorganic substrate 410. For example, when the inorganic substrate 410 is doped with a p-type dopant, the organic material 420 is doped with a p-type dopant. When the inorganic substrate 410 is doped with an n-type dopant, the organic material 420 is doped with an n-type dopant.

A conductive electrode 432 is disposed over the doped organic material 420. The conductive electrode 432 may define a grid pattern. The conductive electrode 432 includes a conductive metal. Non-limiting examples of conductive metals for the conductive electrode 432 include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

Figure 4D:
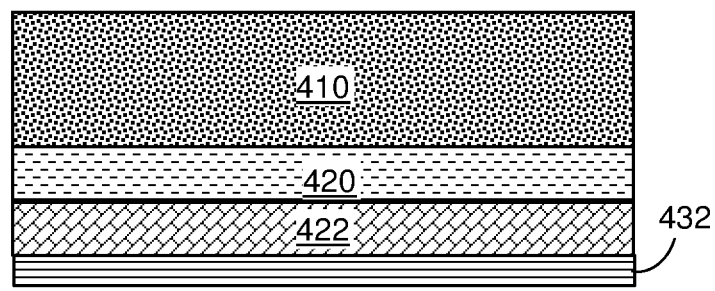

FIG. 4D is a cross-sectional side view of a BSF device including a TCL layer 422. The TCL layer 422 is disposed between the doped organic material 420 and the conductive electrode 432. The TCL layer 422 is optional. The TCL layer 422 may improve lateral carrier collection at the conductive electrode 432. The TCL layer 422 may also serve as an anti-reflective coating.

Other BSF device configurations, in addition to those shown in FIGS. 4C and 4D may be used. For example, front-contact BSF device configurations with a blanket metal or grid may be used. Interdigitated configurations are also suitable.

EXAMPLES

Example 1

A device was formed that included an aluminum layer disposed onto the backside of an n-type silicon substrate (0.01 Ω·cm), a doped pentacene layer (100 nm thick) disposed onto the front side of the n-type silicon layer, and a gold electrode (pad) disposed onto the doped pentacene layer. The silicon substrate was surface passivated with an organic monolayer. For comparison, an analogous device with an undoped pentacene layer was also prepared.

Figure 5A:
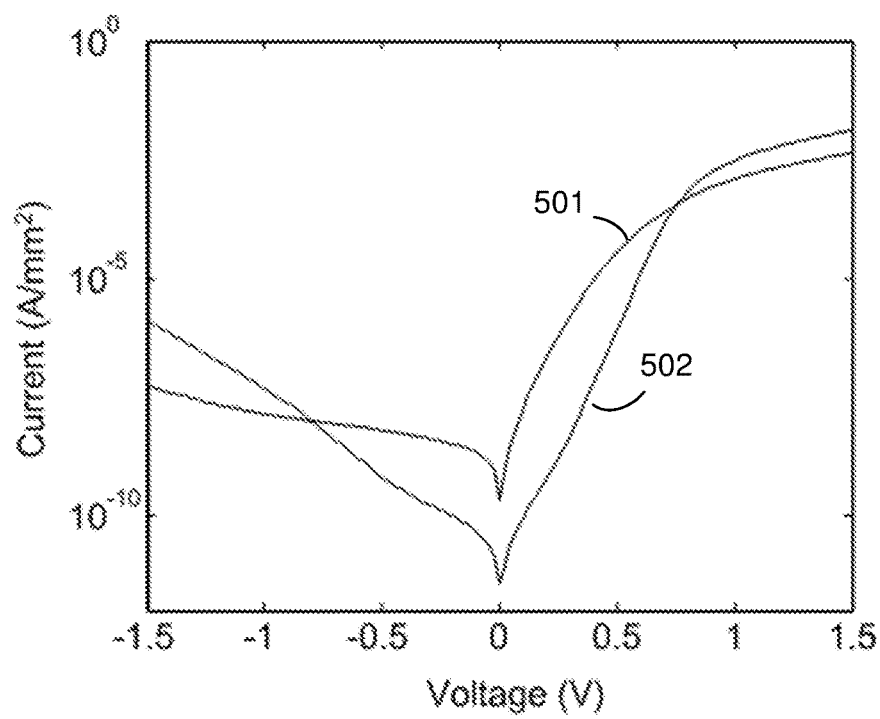
FIG. 5A is a graph comparing current density as a function of voltage in devices with doped organic material layers and devices with undoped material layers.

FIG. 5A is a graph comparing current density as a function of voltage in the doped and undoped devices measured in the dark (e.g., under no illumination). Compared to the undoped device 501, the doped device 502 reduced the current leakage. The reduced current leakage was facilitated by the higher barrier height of the doped pentacene/SAM/silicon heterojunction compared to that of the metal/undoped pentacene/SAM/silicon hybrid junction.

The doped device 502 also reduced the series resistance. The reduced resistance was facilitated by the higher conductivity of the doped pentacene layer compared to that of the undoped pentacene layer. The photo-response of both devices, undoped device 501 and doped device 502, is negligible due to the very high doping of the silicon substrate (not shown).

Example 2

Another device was formed that included an aluminum layer disposed onto the backside of an n-type silicon substrate (1 Ω·cm), a doped pentacene layer (100 nm thick) disposed onto the front side of the n-type silicon layer, and a gold electrode (pad) disposed onto the doped pentacene layer. The silicon substrate was surface passivated with an organic monolayer. For comparison, an analogous device with an undoped pentacene layer was also prepared.

Figure 5B:
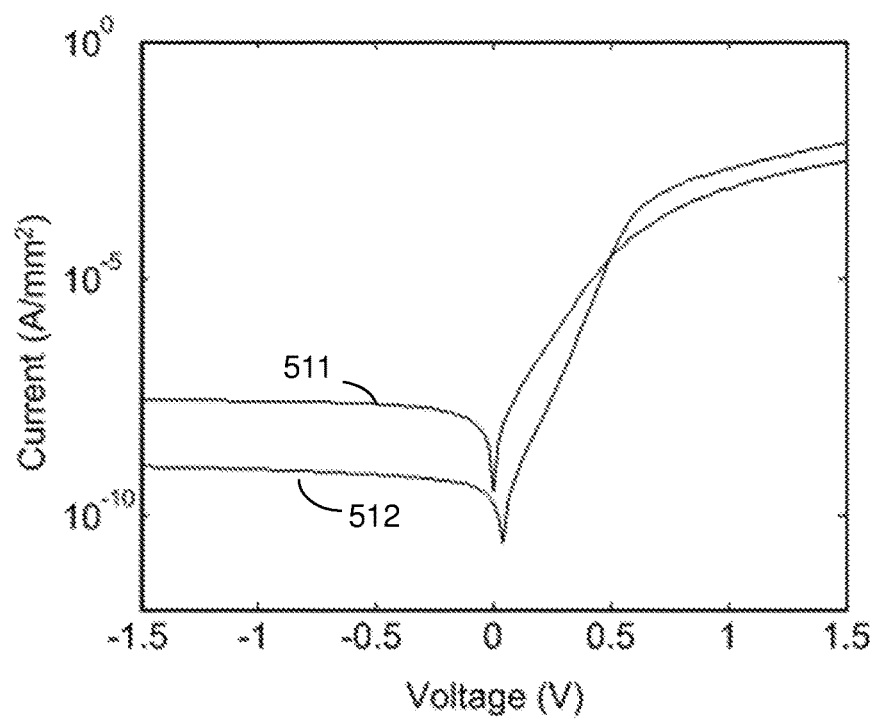
FIG. 5B is a graph comparing current density as a function of voltage in devices with doped organic material layers and devices with undoped organic material layers.

FIG. 5B is a graph comparing current density as a function of voltage in the doped and undoped devices measured in the dark (e.g., under no illumination). Compared to the undoped device 511, the doped device 512 reduced the current leakage. The reduced current leakage was facilitated by the higher barrier height of the doped pentacene/SAM/silicon heterojunction compared to that of the metal/undoped pentacene/SAM/silicon hybrid junction. The doped device 512 also reduced the series resistance. The reduced resistance was facilitated by the higher conductivity of the doped pentacene layer compared to that of the undoped pentacene layer.

Figure 5C:
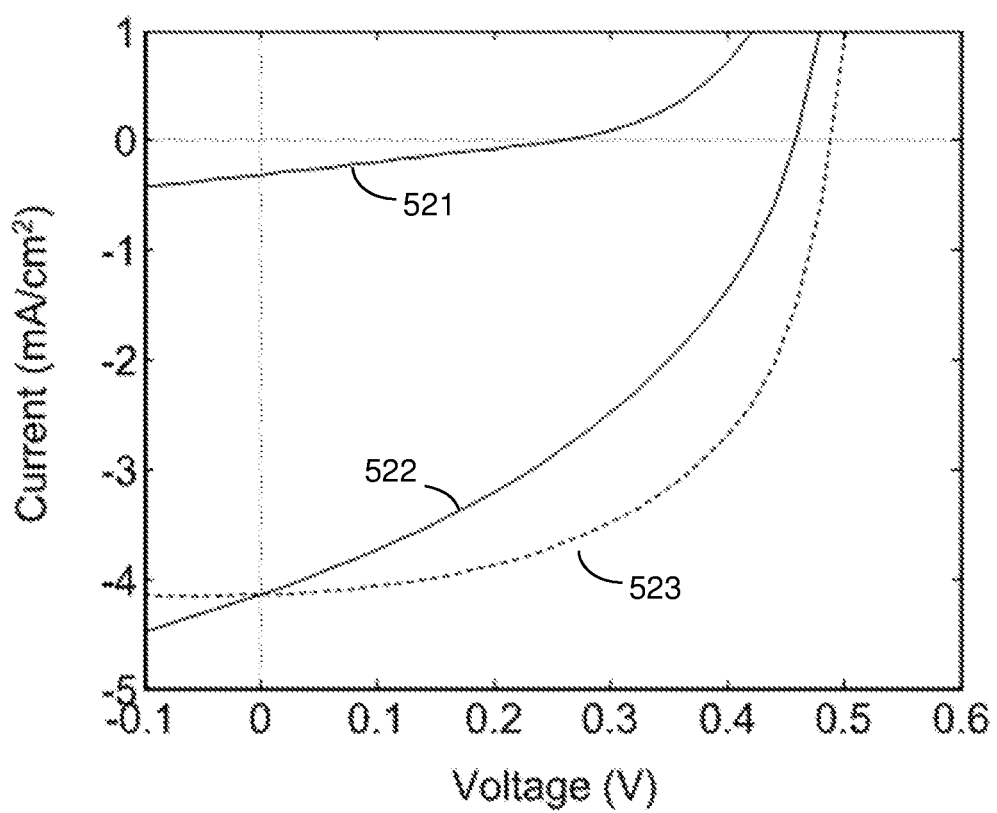
FIG. 5C is a graph comparing the photoresponse of devices with doped organic material layers and devices with undoped organic material layers.

FIG. 5C is a graph comparing the photoresponse of the doped 512 and undoped 511 devices of FIG. 5B. Line 522 corresponds to the photoresponse of the doped device 512, and line 521 corresponds to the photoresponse of the undoped device 511. The photoresponse of the doped device 512 showed significant improvement over that of the undoped device 511.

Line 523 represents the photoresponse of the doped device corrected for the shunt resistance ($R_{shunt}$). Line 523 illustrates that further improvement in the fill-factor and open circuit voltage is possible by isolating the test device, e.g., by patterning the doped organic layer. In addition, further improvements in photoresponse are expected by disposing a transparent conductive layer between the electrode and doped organic layer, and/or using a grid electrode configuration instead of a pad configuration.

As described above, embodiments described herein provide photovoltaic devices with a conductor material layer/doped organic material layer/SAM/inorganic substrate structure. The stacked semiconducting structures form "p-n heterojunctions" instead of hybrid Schottky barriers and dominate the band-bending at the emitter. The higher barrier height of the p-n heterojunction improves carrier splitting. Using a doped organic material also allow for using thin and not yet fully depleted organic layers, which reduces recombination within the organic material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a photovoltaic device, the method comprising:
    etching a native oxide over an inorganic substrate having a surface;
    forming an organic monolayer on the surface of the inorganic substrate, the organic monolayer having the following formula:

~X—(CH$_2$)$_n$—CH$_3$, wherein X is an oxygen or a sulfur; n is an integer from about 4 to about 21; and ~ is a covalent bond between X and the surface of the inorganic substrate to form a covalently bonded ether or a covalently bonded thio-ether on the surface;
    disposing a doped organic material layer onto the organic monolayer; and
    forming a conductive electrode on a portion of the doped organic material layer;
    wherein a concentration of a dopant is selected such that a potential of a p-n heterojunction between the conductive electrode and the inorganic substrate is predominantly determined by a workfunction difference between the doped organic material layer and the inorganic substrate.

2. The method of claim 1, further comprising doping an organic material with an antimony compound.

3. The method of claim 1, wherein the doped organic material layer comprises rubrene, pentacene, or a combination thereof doped with an n-type dopant or a p-type dopant.

4. The method of claim 1, wherein the inorganic substrate comprises a semiconductor material doped with an n-type dopant or a p-type dopant, and the doped organic material layer comprises a dopant that is a same type as the inorganic substrate.

5. The method of claim 1, wherein the inorganic substrate comprises a semiconductor material doped with an n-type dopant or a p-type dopant, and the doped organic material layer comprises a dopant that is a different type than the inorganic substrate.

6. The method of claim 1, wherein the doped organic material is doped with a single electron oxidant, metal organic complex pi-electron acceptor, a silver salt, or any combination thereof.

7. The method of claim 1, further comprising doping an organic material by a solution process.

8. The method of claim 1, further comprising doping an organic material by performing a thermal evaporation process under a vacuum.

* * * * *